United States Patent [19]

Ueno et al.

[11] Patent Number: 4,972,375
[45] Date of Patent: Nov. 20, 1990

[54] PROGRAMMABLE SEMICONDUCTOR MEMORY CIRCUIT

[75] Inventors: Kouji Ueno, Inagi; Yasurou Matsuzaki, Tama; Yuji Tsuchimoto, Kawasaki, all of Japan

[73] Assignee: Fujitsu Limited, Kawasaki, Japan

[21] Appl. No.: 397,838

[22] Filed: Aug. 24, 1989

[30] Foreign Application Priority Data

Aug. 30, 1988 [JP] Japan .................................. 63-216063

[51] Int. Cl.$^5$ .............................................. G11C 13/00
[52] U.S. Cl. ................................. 365/226; 365/189.11
[58] Field of Search ..................... 365/189.11, 226, 227

[56] References Cited

U.S. PATENT DOCUMENTS 4,881,199  11/1989  Kowalski ........................ 365/189.11
4,901,280  2/1990   Patel ................................ 365/189.11

*Primary Examiner*—Terrell W. Fears
*Attorney, Agent, or Firm*—Staas & Halsey

[57] ABSTRACT

A programmable semiconductor memory circuit comprises a memory cell array, a write circuit which is driven by a first power source voltage only in a write mode for writing data into memory cells of the memory cell array, an address input circuit which is driven by a second power source voltage for supplying an address signal to the memory cell array, and an input level correcting circuit supplied with the first power source voltage only in the write mode for supplying the first power source voltage to the address input circuit. The second power source voltage has a voltage higher in the write mode than in a read mode. The address input circuit has an arrangement such that an input threshold value thereof changes when the second power source voltage changes. The input level correcting circuit supplies the first power source voltage to the address input circuit to pull up a signal level at an input of the address input circuit in the write mode so that a signal having a high logic level at the input of the address input circuit is greater than the input threshold value of the address input circuit.

9 Claims, 6 Drawing Sheets

FIG.3 (PRIOR ART)
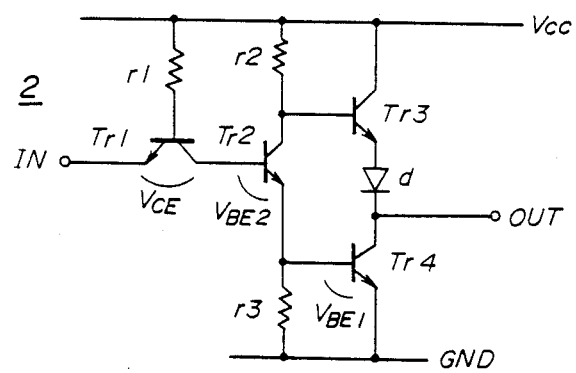
FIG.4A (PRIOR ART)
FIG.4B (PRIOR ART)
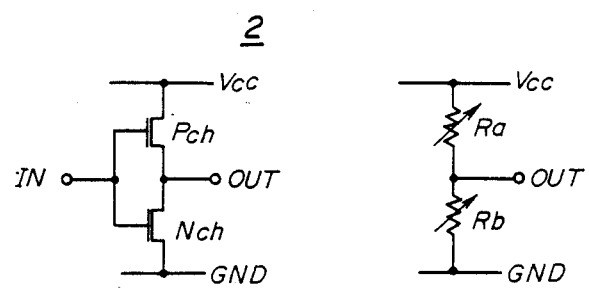
FIG.5 (PRIOR ART)
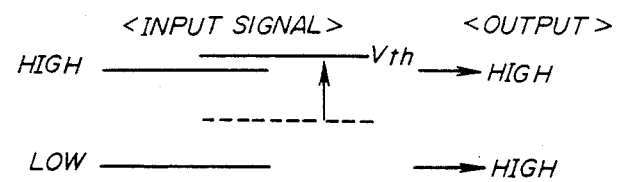

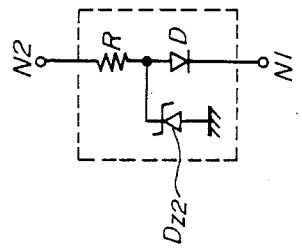
FIG.9
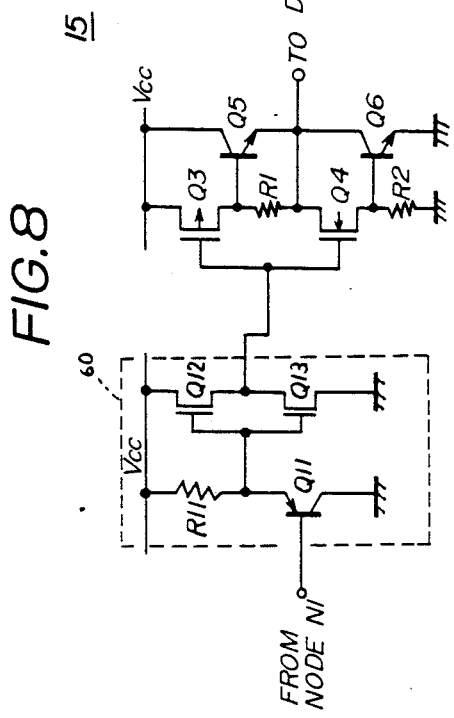
FIG.8
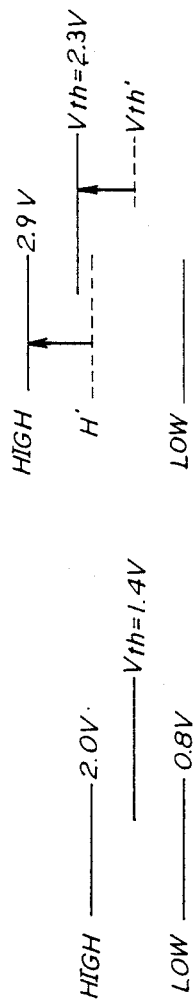
FIG.10B
FIG.10A

PROGRAMMABLE SEMICONDUCTOR MEMORY CIRCUIT

BACKGROUND OF THE INVENTION

The present invention generally relates to programmable semiconductor memory circuits, and more particularly to a programmable semiconductor memory circuit which has an input circuit with an input threshold value which changes depending on a change of a power source voltage.

As one example of a programmable device, there is a bipolar programmable read only memory (PROM) to which a user can electrically write data. Such a bipolar PROM is popularly used in various fields. Generally, the user writes the data into the bipolar PROM in the following manner. That is, the user selects a memory cell of a memory cell array via an address input circuit by an address which is received from an address driver, and writes the data into the selected memory cell via a write circuit which is driven by a voltage which is received from a programming power source circuit which is used for the programming. In this case, the address input circuit is not limited to a transistor transistor logic (TTL). Recently, a composite circuit such as a complementary metal oxide semiconductor (CMOS) circuit and a bipolar CMOS (BiCMOS) circuit is used for the address input circuit.

Generally, the input threshold value of the CMOS or BiCMOS circuit changes depending on a change of a power source voltage. For this reason, when the CMOS or BiCMOS circuit is used for the address input circuit of the bipolar PROM and the input threshold value of the address input circuit changes due to the change in the power source voltage, an output signal level of the address input circuit is no longer in conformance with a TTL level which is used by the write circuit and a memory cell array of the bipolar PROM. As will be described later, it thus becomes necessary to design the write circuit exclusively for the bipolar PROM which has the CMOS or BiCMOS address input circuit.

FIG.1 shows an essential part of an example of a conventional bipolar PROM. The bipolar PROM generally comprises an address input circuit 2, a memory cell array 3, a programming power source circuit 4, a write circuit 5, and a decoder 6. In a write mode, a predetermined memory cell within the memory cell array 3 is selected by an address which is received from an address driver (writer) 1 via the address input circuit 2 and the decoder 6. The write-in of data to the predetermined memory cell is made via the write circuit 5 which is driven by the programming power source circuit 4.

In the write mode, a power source voltage Vcc is set to 7 V as shown in FIG.2(A) and a write voltage Vw from the programming power source circuit 4 is set to 20 V as shown in FIG.2(B), for example. On the other hand, in the read mode, the power source voltage Vcc is set to 5 V as shown in FIG.2(A) and the write voltage Vw from the programming power source circuit 4 is set to 0 V. The power source voltage Vcc during the write mode is set greater than that during the read mode because in the write mode there is a need to supply a large current to the selected memory cell so as to break and short-circuit a junction of the selected memory cell.

The memory cell array 3 of the bipolar PROM usually employs the TTL. For this reason, the address input circuit 2 is TTL circuit and a PROM writer which programs the bipolar PROM is designed to operate with the TTL level. FIG.3 shows an example of the TTL address input circuit 2. The TTL address input circuit 2 comprises transistors Tr1 through Tr4, resistors r1 through r3, and a diode d which are connected as shown. Vcc denotes the power source voltage and GND denotes the ground voltage. An input threshold value Vth of this TTL address input circuit 2 can be described by Vth=$V_{BE1}$+$V_{BE2}$−$V_{CE}$, where $V_{BE1}$ denotes a base-emitter voltage of the transistor Tr4, $V_{BE2}$ denotes a base-emitter voltage of the transistor Tr2, and $V_{CE}$ denotes a collector-emitter voltage of the transistor Tr1. Hence, the input threshold value Vth of the address input circuit 2 will not change even when the power source voltage Vcc changes.

When employing the BiCMOS structure for the bipolar PROM, it is advantageous to use a CMOS circuit for the address input circuit 2 because a low power consumption and a high-speed operation can be realized and there is study to employ the CMOS circuit for the address input circuit 2. But when the CMOS circuit is used for the address input circuit 2, problems occur since the input threshold value of the CMOS circuit changes when the power source voltage Vcc changes and the PROM writer is designed to operate with the TTL level.

In the case of the CMOS (or BiCMOS) address input circuit 2 which comprises a p-channel transistor Pch and an n-channel transistor Nch which are connected in series between the power source voltage Vcc and the ground GND as shown in FIG. 4A, for example, the input threshold value Vth is set to an intermediate voltage between the power source voltage Vcc and the ground. For example, this intermediate voltage is approximately Vcc/2. For this reason, the input threshold value Vth of the CMOS address input circuit 2 changes when the power source voltage Vcc changes.

FIG. 4B shows an equivalent circuit of the CMOS address input circuit 2. In FIG. 4B, the CMOS address input circuit 2 is illustrated as a series connection of two variable resistors Ra and Rb the resistances of which vary depending on the input voltage. An output voltage $V_{OUT}$ can be described b $V_{OUT}$=Vcc×Rb/(Ra +Rb). For example, the input threshold value Vth of the CMOS address input circuit 2 can be set to approximately 1.4 V in the read mode but the input threshold value Vth increases to approximately 2.1 V when the power source voltage Vcc is increased in the write mode. But according to a typical TTL level, a low logic level is 0.8 V or less and a high logic level is 2.0 V or greater and the PROM writer is designed with this typical TTL level. As a result, even when an input voltage of 2.0 V which is a high logic level according to the TTL level is applied to the CMOS address input circuit 2 in the write mode when the input threshold value Vth is 2.1 V, the CMOS address input circuit 2 regards this input voltage as a low logic level since it is less than the input threshold value Vth as shown in FIG.5.

Therefore, the CMOS address input circuit 2 carries out an erroneous operation in the write mode in response to the input voltage which is set in conformance with the TTL level. Hence, the PROM writer which operates with the TTL level cannot be used when the CMOS address input circuit 2 is used because the TTL level cannot be discriminated correctly in the write mode. When the input threshold value of the CMOS address input circuit 2 is reduced in the write mode to enable a correct discrimination of the high and low logic levels in conformance with the TTL, it then becomes impossible to correctly discriminate the high and low logic levels in the read mode. For this reason, there is a problem in that the PROM writer must be designed to operate with the CMOS level if the CMOS address input circuit 2 is to be used. However, because virtually all of the existing PROM writers are already designed to operate with the TTL level, it would be extremely troublesome and expensive to design new PROM writers exclusively for the CMOS address input circuit 2 to make the same programming as the existing PROM writers.

SUMMARY OF THE INVENTION

Accordingly, it is a general object of the present invention to provide a novel and useful programmable semiconductor memory circuit in which the problems described above are eliminated.

Another and more specific object of the present invention is to provide a programmable semiconductor memory circuit comprising a memory cell array having memory cells, a write circuit which is driven by a first power source voltage only in a write mode for writing data into the memory cells of the memory cell array, an address input circuit which is driven by a second power source voltage for supplying an address signal to the memory cell array, where the second power source voltage has a voltage higher in the write mode than in a read mode and the address input circuit has an arrangement such that an input threshold value thereof changes when the second power source voltage changes, and an input level correcting circuit supplied with the first power source voltage only in the write mode for supplying the first power source voltage to the address input circuit to pull up a signal level at an input of the address input circuit in the write mode so that a signal having a high logic level at the input of the address input circuit is greater than the input threshold value of the address input circuit. According to the programmable semiconductor memory circuit of the present invention, the correct operation of the address input circuit is ensured even when the address input circuit is made of a CMOS or BiCMOS circuit to realize a low power consumption and a high speed operation, and the existing PROM writer can be used as it is without the need of a new PROM writer designed exclusively for the CMOS or BiCMOS address input circuit.

Other objects and further features of the present invention will be apparent from the following detailed description when read in conjunction with the accompanying drawings.

BRIEF DESCRIPTION OF THE DRAWINGS

FIG. 3 is a circuit diagram showing an example of a TTL address input circuit;

FIG. 4A is a circuit diagram showing an example of a CMOS address input circuit;

FIG. 4B shows an equivalent circuit of the CMOS address input circuit shown in FIG. 4A;

FIG. 5 is a diagram for explaining the change of the input threshold value in the CMOS address input circuit and the problems generated thereby;

FIG. 8 is a circuit diagram showing an embodiment of an address input circuit of the embodiment;

FIG. 9 is a circuit diagram showing an embodiment of an input level correcting circuit of the embodiment;

FIGS. 10A and 10B are diagrams for explaining the operation of the embodiment.

DESCRIPTION OF THE PREFERRED EMBODIMENTS

Figure 6:
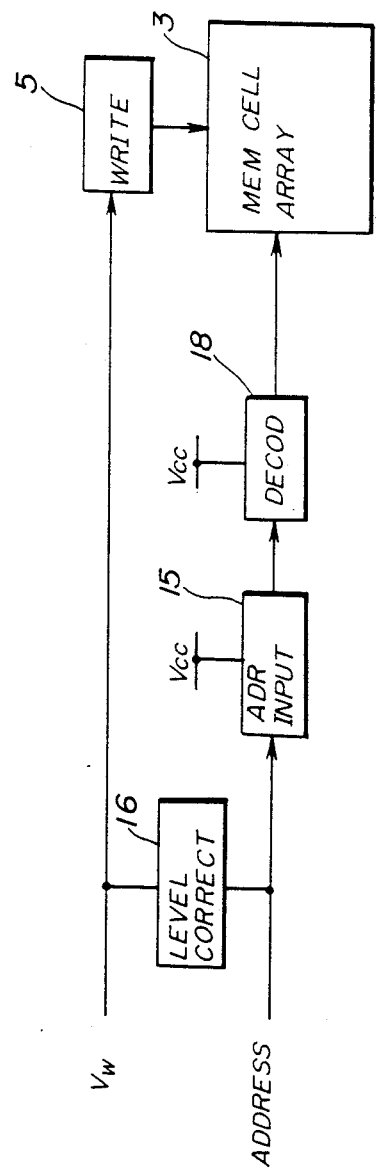
FIG. 6 is a system block diagram generally showing a programmable semiconductor memory circuit according to the present invention for explaining an operating principle thereof.

FIG. 6 generally shows a programmable semiconductor memory circuit according to the present invention for explaining an operating principle thereof. The write circuit 5 is driven by the write power source voltage $V_w$ from a programming power source circuit (not shown) only during the write mode. An address input circuit 15 is driven by the power source voltage $V_{cc}$ which is higher in the write mode than in the read mode and supplies an address signal to the memory cell array 3 via a decoder 18. The address input circuit 15 is made of a CMOS or BiCMOS circuit. An input level correcting circuit 16 is coupled between a line of the write power source voltage $V_w$ and a line of the address signal.

The write power source voltage $V_w$ is supplied to the address input circuit 15 only in the write mode. In the write mode, the input threshold value of the address input circuit 15 increases due to the change in the power source voltage $V_{cc}$, but the input signal level of the address input circuit 15 is pulled up by the write power source voltage $V_w$ to make up for the insufficient input signal level with respect to the increased input threshold value of the address input circuit 15. Accordingly, even when the input threshold value of the address input circuit 15 increases in the write mode, it is possible to correctly drive the address input circuit 15 with the TTL level and the existing PROM writer can be used as it is for the programming. In other words, there is no need to design a new PROM writer exclusively for the address input circuit 15 which is a CMOS or BiCMOS circuit.

Figure 7:
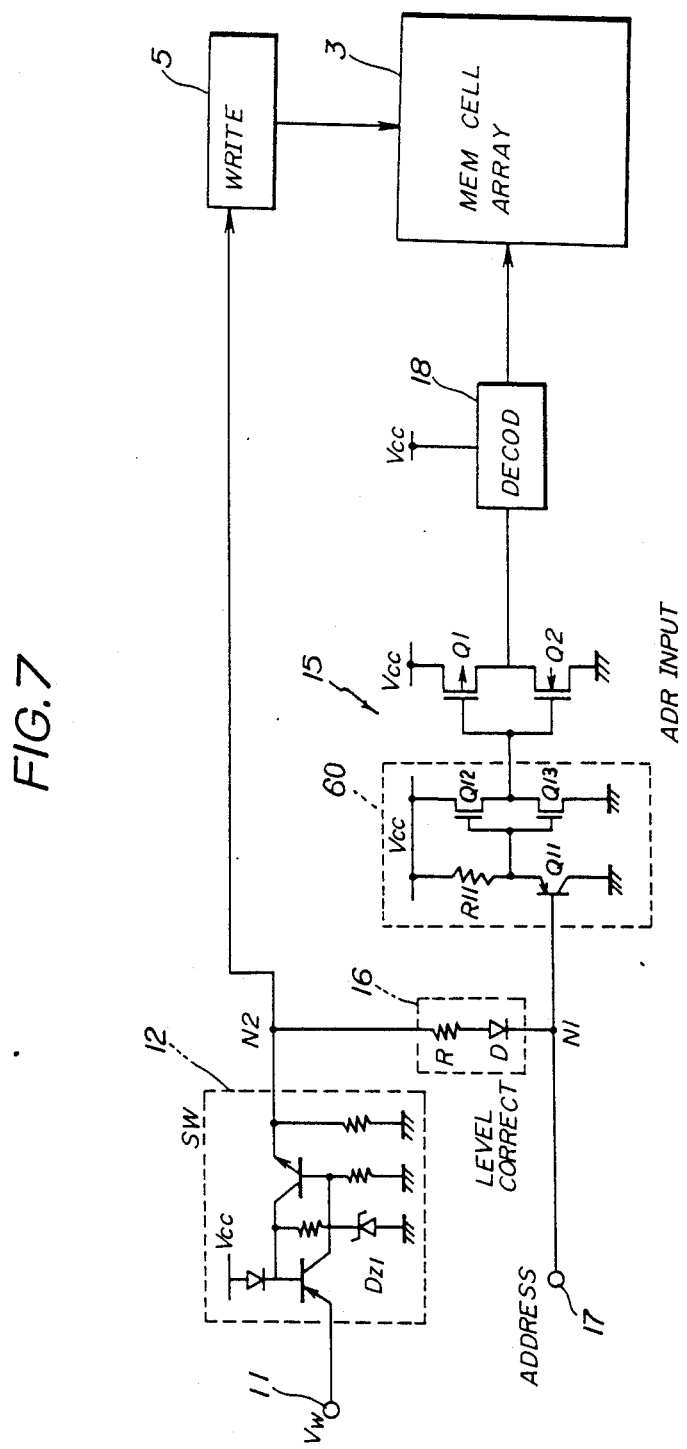
FIG. 7 is a system block diagram showing an essential part of an embodiment of the programmable semiconductor memory circuit according to the present invention.

FIG. 7 shows an essential part of an embodiment of the programmable semiconductor memory circuit according to the present invention. In FIG. 7, those parts which are substantially the same as those corresponding parts in FIG. 6 are designated by the same reference numerals. The address input circuit 15 shown in FIG. 7 is a CMOS circuit comprising a circuit part 60, a p-channel MOS transistor Q1 and an n-channel MOS transistor Q2 which are connected in series between the power source voltage $V_{cc}$ and the ground. The circuit part 60 comprises transistors Q11 through Q13 and a resistor R11 which are connected as shown. But it is of course possible to use other arrangements for the address input circuit 15 such as an embodiment shown in FIG. 8. In FIG. 8, the address input circuit 15 is a BiC- MOS circuit comprising the circuit part 60, a p-channel MOS transistor Q3 and an n-channel MOS transistor Q4 which are connected in series between the power source voltage Vcc and the ground, two npn transistors Q5 and Q6 which are connected in series between the power source voltage Vcc and the ground, and resistors R1 and R2 which are connected as shown.

Figure 1:
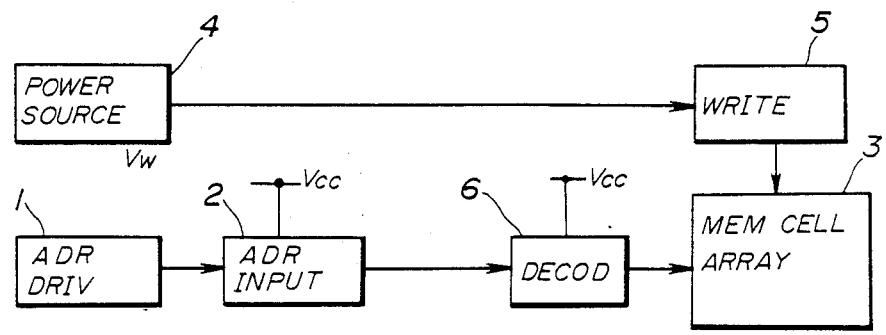
FIG. 1 is a system block diagram showing an essential part of an example of a conventional bipolar PROM.
Figure 2:
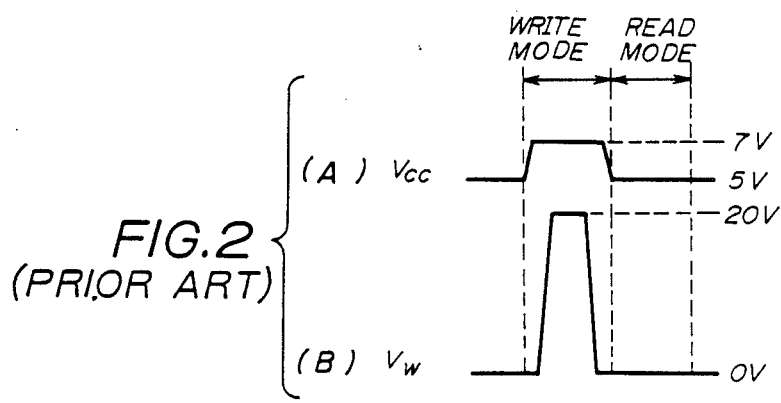
FIGS. 2(A) and 2(B) show power source voltages used during write and read modes of the bipolar PROM.

In FIG. 7, the write power source voltage Vw is applied to a programming terminal 11 and is supplied to a switching circuit 12. The write power source voltage Vw is also used to generate a chip enable signal which is supplied to an output buffer (not shown) as will be described later. The switching circuit 12 is turned ON when the supplied write power source voltage Vw exceeds a voltage which is determined by a threshold voltage of a Zener diode $D_{Z1}$. In other words, the switching circuit 12 is turned ON only in the write mode when the write power source voltage Vw is 20 V as shown in FIG. 2(B). When the switching circuit 12 is ON, the write power source voltage Vw is supplied to the write circuit 5.

The input level correcting circuit 16 comprises a resistor R and a diode D which are connected in series between nodes N1 and N2. The node N1 connects the address input circuit 15 and the input level correcting circuit 16 to a terminal 17 which receives the address signal. On the other hand, the node N2 connects the switching circuit 12 and the write circuit 5.

Next, a description will be given of the operation of the embodiment. In the write mode, the power source voltage Vcc supplied to the address input circuit 15 is increased to 7 V as shown in FIG. 2(A). In this state, a predetermined memory cell within the memory cell array 3 is selected by the address signal which is received from the terminal 17 via the address input circuit 15 and the decoder 18. On the other hand, the write power source voltage Vw which is 20 V as shown in FIG. 2(B) is supplied to the write circuit 5 via the programming terminal 11 and the switching circuit 12. The data is written into the predetermined memory cell by the operation of the write circuit 5.

When the power source voltage Vcc is increased from 5 V to 7 V, the input threshold value of the address input circuit 15 increases to 2.3 V, for example. But according to this embodiment, the write power source voltage Vw from the switching circuit 12 is supplied to the address input circuit 15 via the input level correcting circuit 16 in the write mode so as to pull up the level of the signal at the input of the address input circuit 15 and make up for the increase in the input threshold value. In other words, the level of the signal which has a high logic level at the input of the address input circuit 15 is pulled up to such a level that it is correctly discriminated as a high logic level in the address input circuit 15 which has the increased input threshold value in the write mode. Of course, the level of the signal which has a low logic level at the input of the address input circuit 15 is maintained lower than the input threshold value thereof even when the pull up takes place. Accordingly, even when the input threshold value of the address input circuit 15 becomes 2.3 V, for example, the signal level at the input of the address input circuit 15 is pulled up to a sufficiently high level so that the high logic level in conformance with the TTL is pulled up to a value greater than 2.3 V at the input of the address input circuit 15. As a result, a correct operation of the address input circuit 15 is ensured and it is possible to use the existing PROM writer which operates with the TTL level as it is.

On the other hand, in the read mode, the power source voltage Vcc supplied to the address input circuit 15 is set to 5 V as shown in FIG. 2(A). In this state, a predetermined memory cell within the memory cell array 3 is selected by the address signal which is received from the terminal 17 via the address input circuit 15 and the decoder 18. On the other hand, the write power source voltage Vw which is 0 V as shown in FIG. 2(B) is supplied to the switching circuit 12 and the switching circuit 12 is OFF. Hence, the voltage which is supplied to the address input circuit 15 via the input level correcting circuit 16 is 0 V and the signal level within the address input circuit 15 returns to the normal CMOS level. The data is read out from the predetermined memory cell by operating a read circuit (not shown) which will be described later.

The input level correcting circuit 16 is not limited to that shown in FIG. 7, but it is of course possible to use other arrangements for the input level correcting circuit 16 such as an embodiment shown in FIG. 9. In FIG. 9, the input level correcting circuit 16 comprises in addition to the resistor R and the diode D a Zener diode $D_{Z2}$ which is connected as shown. The Zener diode $D_{Z2}$ clamps the high level signal to a predetermined value to prevent an excessively large voltage from being supplied to the address input circuit 15.

FIGS. 10A and 10B are diagrams for explaining the operation of the above described embodiment. FIG. 10A shows the high and low voltage levels at the input (node N1) of the address input circuit 15 in the TTL read mode. In this state, the potential at the node N2 is 0 V and the input level correcting circuit 16 is inactive. FIG. 10B shows the limit of the high and low voltage levels at the input (node N1) of the address input circuit 15 in the write mode. In this state, the potential at the node N2 is 20 V and the input level correcting circuit 16 is active. Thus, the input threshold value Vth of the address input circuit 15 rises to 2.3 V but the potential at the node N1 also rises as indicated by the solid line in FIG. 10B. That is, the low voltage level remains at 0.8 V but the high voltage level rises to 2.9 V, and the input threshold value Vth is always set to an intermediate value between the high and low voltage levels.

Figure 11:
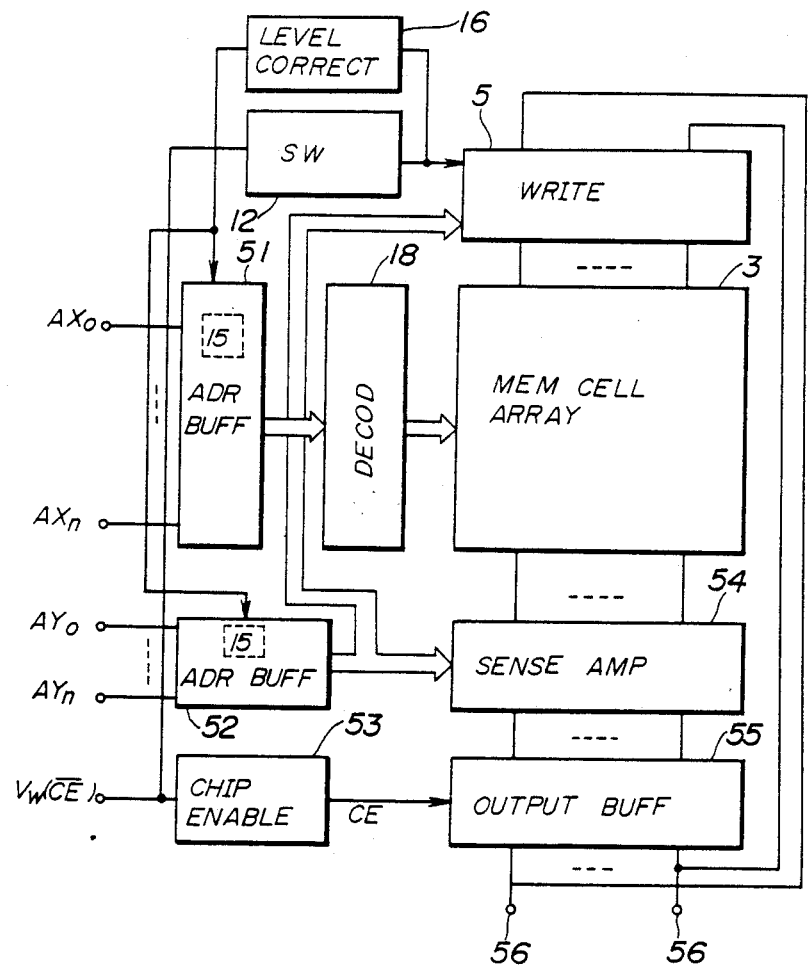
FIG. 11 is a system block diagram showing the embodiment in more detail.

FIG. 11 shows the embodiment in more detail. The programmable semiconductor memory circuit comprises the memory cell array 3, the write circuit 5, X and Y address buffers 51 and 52, the decoder 18, the switching circuit 12, the input level correcting circuit 16, a chip enable signal generator 53, a sense amplifier 54, and an output buffer 55. The address input circuit 15 is provided within the address buffers 51 and 52. The basic construction of this memory circuit is known as a programmable read only memory (PROM).

The decoder 18 selects one word line responsive to a signal received from the X-address buffer 51. In a write mode, the write circuit 5 selects one bit line responsive to a signal received from the Y-address buffer 52. In a read mode, the sense amplifier 54 selects one bit line responsive to the signal received from the Y-address buffer 52. The output buffer 55 outputs data read out from a selected memory cell of the memory cell array 3 when enabled by a chip enable signal CE. This chip enable signal CE is output from the chip enable signal generator 53 which generates the chip enable signal CE from the write power source voltage Vw ($\overline{CE}$).

In the write mode, the address buffers 51 and 52 select a memory cell of the memory cell array 3 via the decoder 18 and the write circuit 5. In addition, a write current is applied to the selected memory cell from a terminal 56 via the write circuit 5.

In the read mode, the address buffers 51 and 52 select a memory cell of the memory cell array 3 via the decoder 18 and the sense amplifier 54. The data read out from the selected memory cell is output from the terminal 56 via the sense amplifier 54 and the output buffer 55.

Further, the present invention is not limited to these embodiments, but various variations and modifications may be made without departing from the scope of the present invention.

What is claimed is:

1. A programmable semiconductor memory circuit comprising:
    a memory cell array having memory cells;
    a write circuit which is driven by a first power source voltage only in a write mode for writing data into the memory cells of said memory cell array;
    an address input circuit which is driven by a second power source voltage for supplying an address signal to said memory cell array, said second power source voltage having a voltage higher in the write mode than in a read mode, said address input circuit having an arrangement such that an input threshold value thereof changes when the second power source voltage changes; and
    an input level correcting circuit supplied with the first power source voltage only in the write mode for supplying the first power source voltage to said address input circuit to pull up a signal level at an input of said address input circuit in the write mode so that a signal having a high logic level at the input of said address input circuit is greater than the input threshold value of said address input circuit.

2. The programmable semiconductor memory circuit as claimed in claim 1 wherein said address input circuit is made of a complementary metal oxide semiconductor circuit.

3. The programmable semiconductor memory circuit as claimed in claim 1 wherein said address input circuit is made of a bipolar complementary metal oxide semiconductor circuit.

4. The programmable semiconductor memory circuit as claimed in claim 1 wherein said input level correcting circuit comprises a resistor and a diode which are connected in series between first and second nodes, said first node being supplied with the first power source voltage, said second node being supplied with the address signal.

5. The programmable semiconductor memory circuit as claimed in claim 4 wherein said input level correcting circuit further comprises a Zener diode which is connected to a node between said resistor and said diode for clamping the signal which has the high logic level at the input of said address input circuit to a predetermined voltage.

6. The programmable semiconductor memory circuit as claimed in claim 1 which further comprises a switching circuit supplied with the first power source voltage and coupled to said write circuit and said input level correcting circuit, said first power source voltage having a voltage higher in the write mode than in a read mode, said switching circuit being turned ON only in response to the first power source voltage in the write mode to supply the first power source voltage to said write circuit and said input level correcting circuit.

7. The programmable semiconductor memory circuit as claimed in claim 6 wherein said first power source voltage in the write mode is 20 V and in the read mode is 0 V, and said second power source voltage in the write mode is 7 V and in the read mode is 5 V.

8. The programmable semiconductor memory circuit as claimed in claim 1 wherein said write circuit employs a transistor transistor logic.

9. The programmable semiconductor memory circuit as claimed in claim 8 which is a bipolar programmable read only memory.

* * * * *

UNITED STATES PATENT AND TRADEMARK OFFICE
CERTIFICATE OF CORRECTION

PATENT NO. : 4,972,375
DATED : Nov. 20, 1990
INVENTOR(S) : UENO et al.

It is certified that error appears in the above-identified patent and that said Letters Patent is hereby corrected as shown below:

Col. 2, line 44, change "described b" to --described by--.

Signed and Sealed this

Nineteenth Day of May, 1992

Attest:

DOUGLAS B. COMER

Attesting Officer    Acting Commissioner of Patents and Trademarks